United States Patent

Pascucci et al.

Patent Number: 5,663,921
Date of Patent: Sep. 2, 1997

[54] INTERNAL TIMING METHOD AND CIRCUIT FOR PROGRAMMABLE MEMORIES

[75] Inventors: Luigi Pascucci, Sesto San Giovanni; Marco Olivo, Bergamo; Carla Maris Golla, Sesto San Giovanni, all of Italy

[73] Assignee: SGS-Thomson Microelectronics S.r.l., Agrate Brianze, Italy

[21] Appl. No.: 391,159

[22] Filed: Feb. 21, 1995

[30] Foreign Application Priority Data

Feb. 18, 1994 [EP] European Pat. Off. ............ 94830070

[51] Int. Cl.$^6$ ............................................. G11C 7/00
[52] U.S. Cl. ....................... 365/233; 365/194; 365/195; 365/225.7
[58] Field of Search ........................... 365/233, 233.5, 365/194, 189.08, 203, 195, 225.7

[56] References Cited

U.S. PATENT DOCUMENTS

| | | |
|---|---|---|
| 4,425,633 | 1/1984 | Swain ........................ 365/194 |
| 4,687,951 | 8/1987 | McElroy ..................... 307/269 |
| 4,970,418 | 11/1990 | Masterson ................. 365/233 |
| 5,054,002 | 10/1991 | Ninomiya et al. ......... 365/194 |
| 5,301,278 | 4/1994 | Bowater et al. |
| 5,381,379 | 1/1995 | Fukumoto ................. 365/195 |
| 5,424,985 | 6/1995 | McClure et al. .......... 365/194 |

FOREIGN PATENT DOCUMENTS 0 470 719   2/1992   European Pat. Off. ........ G11C 16/06

Primary Examiner—Tan T. Nguyen
Attorney, Agent, or Firm—David V. Carlson; Seed and Berry LLP

[57] ABSTRACT

A circuit generates flexible timing permitting a slow or fast overall timing configuration, and two configurations of the precharge and detecting intervals by providing both with two (short or long) duration levels. For this purpose, the circuit includes a variable, asymmetrical propagation line composed of a succession of elementary delay elements enabled or disabled on the basis of memorized logic signals, the state of which is determined when debugging the memory in which the circuit is implemented.

21 Claims, 2 Drawing Sheets

INTERNAL TIMING METHOD AND CIRCUIT FOR PROGRAMMABLE MEMORIES

CROSS-REFERENCE TO RELATED APPLICATIONS

The present application claims priority from European Patent Application No 94830070.2, filed Feb. 18, 1994, and incorporated herein by reference. The present application is related to pending U.S. patent application entitled "METHOD AND CIRCUIT FOR TIMING THE LOADING OF NONVOLATILE-MEMORY OUTPUT DATA", by Luigi Pascucci, Marco Maccarrone and Marco Olivo, Ser. No. 08/391,160, and filed on, Feb. 21, 1995, which claims priority from European Patent Application No. 94830069.4, filed on Feb. 18, 1994; U.S. Patent Application entitled "LOAD SIGNAL GENERATING METHOD AND CIRCUIT FOR NONVOLATILE MEMORIES", by Luigi Pascucci and Carla Maria Golla, Ser. No. 08/391,146, and filed on Feb. 21,1995, which claims priority from European Patent Application No. 94830071.0, filed on Feb. 18, 1994; U.S. patent application entitled "PROGRAMMABLE LOGIC ARRAY STRUCTURE FOR SEMICONDUCTOR NONVOLATILE MEMORIES, PARTICULARLY FLASH-EEPROMs", by Silvia Padoan and Luigi Pascucci, Ser. No. 08/391,149, and filed on Feb. 21,1995, which claims priority from European Patent Application No. 94830072.8, filed on Feb. 18, 1994; U.S. patent application entitled "METHOD AND CIRCUIT FOR SUPPRESSING DATA LOADING NOISE IN NONVOLATILE MEMORIES", by Luigi Pascucci, Carla Maria Golla and Marco Maccarrone, Ser. No. 08/391,147, and filed on Feb. 21,1995, which claims priority from European Patent Application No. 94830073.6, filed on Feb. 18, 1994; U.S. patent application entitled "METHOD AND CIRCUIT FOR TIMING THE READING OF NONVOLATILE MEMORIES", by Luigi Pascucci, Silvia Padoan, Carla Mafia Golla, Marco Maccarrone and Marco Olivo, Ser. No. 08/391,920, and filed on Feb. 21,1995, which claims priority from European Patent Application No. 94830074.4, filed on Feb. 18, 1994, all of which are incorporated herein by reference.

TECHNICAL FIELD

The present invention relates to an internal timing method and circuit for programmable, particularly flash, memories.

BACKGROUND OF THE INVENTION

As is known, an essential part of the design of a memory is the approach adopted as regards internal timing control, e.g., for timing the read operations.

At present, for devices requiring timing, two approaches are adopted: static and dynamic.

In the static approach, each internal control signal is composed of a succession of events which propagate naturally in response to a given external stimulus. Generally speaking, the static approach provides solely for temporal signal propagation, and is not an actual internal timing, thus greatly simplifying the amount of design work involved. On the other hand, the fully static approach invariably presents drawbacks in terms of high consumption and low speed.

In the dynamic approach, which is normally adopted for memories to overcome the above drawbacks, timing consists in generating appropriate timing signals of given duration, for enabling and disabling corresponding operating steps and so reducing consumption and permitting the use of intrinsically faster circuits. The dynamic approach, however, also presents drawbacks substantially in terms of rigidity and the fact that it fails to allow for any deviation in the reaction rate of the memory elements. As such, in the event of one location deviating noticeably with respect to the average performance of the others, it must be replaced by resorting to redundancy. Alternatively, provision may be made at the design stage for a more relaxed timing, to allow for even considerable differences in the reaction times of the memory elements. Neither solution, however, is wholly satisfactory, in that both waste resources which may be otherwise employed, and slow down the memory considerably.

SUMMARY OF THE INVENTION

It is an object of the present invention to provide a timing system designed to overcome the drawbacks typically associated with known solutions.

According to the present invention, there are provided an internal timing method for programmable memories and a timing circuit for use with programmable memories.

In practice, according to the present invention, the timing circuit comprises delay lines enabled selectively according to the characteristics of the memory of which the circuit forms part or which is timed by the circuit. To determine the characteristics of the memory, tests are conducted to determine whether slow or fast timing is required, and whether the precharge and detecting steps may be more or less rapid. Appropriately stored signals are then generated for enabling, or not, unit delay elements on the delay lines.

DETAILED DESCRIPTION OF THE INVENTION

Figure 1:
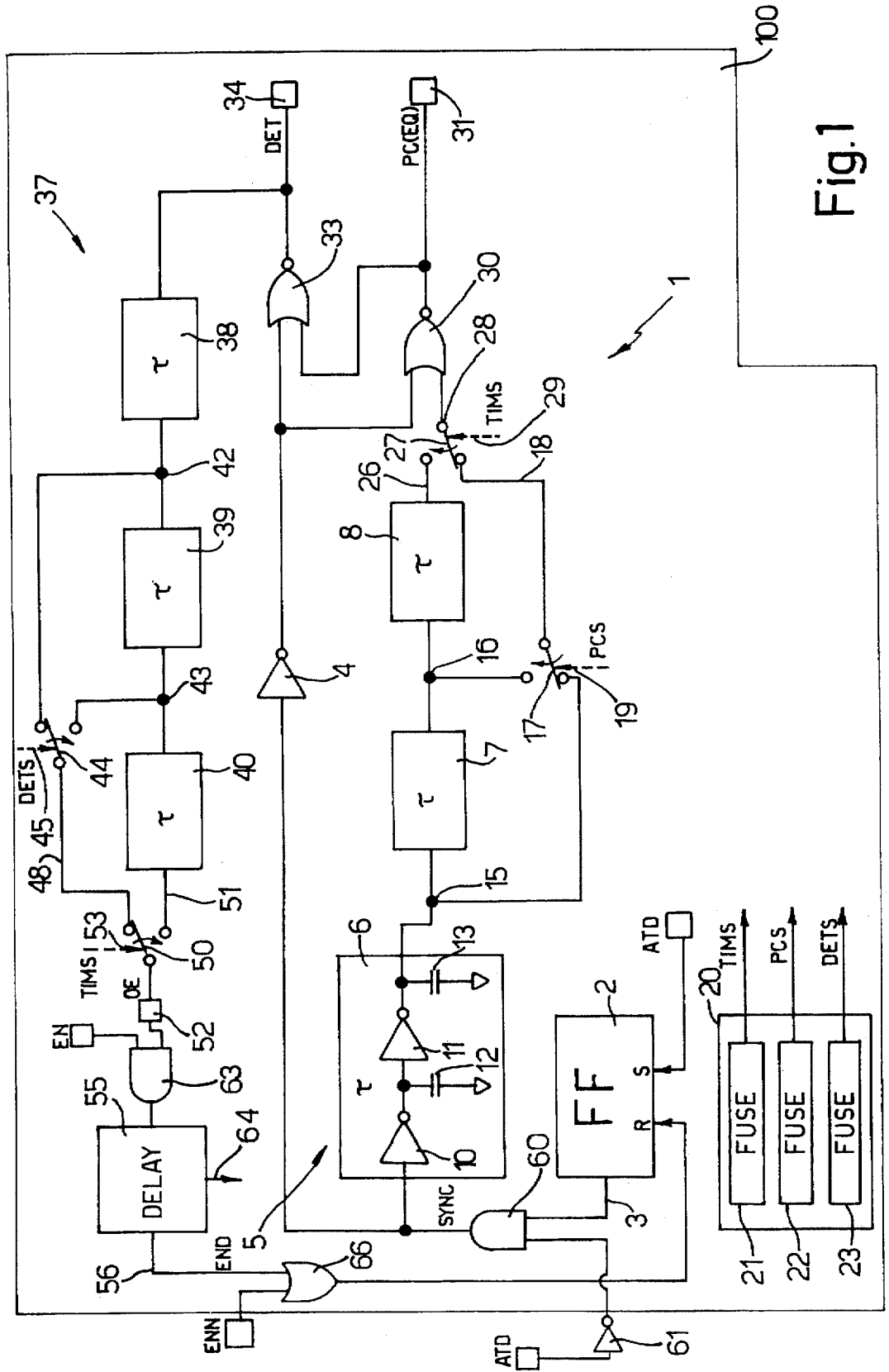
FIG. 1 is a block diagram of the timing circuit according to the present invention.

Number 1 in FIG. 1 indicates an internal timing circuit forming part of a programmable, e.g., flash-EEPROM, memory 100, and which provides for generating two signals essential to a dynamically timed memory: a precharge (or equalizing) signal, and a detecting signal. In the embodiment shown, circuit 1 provides for flexible timing permitting a slow or fast overall timing configuration, and a dual configuration of the precharge (or equalizing) and detecting intervals by providing each with two (short or long) duration levels.

More specifically, circuit 1 comprises a timing logic block 2, here in the form of a flip-flop, having a set input S supplied with a address change indicating signal ATD (e.g., a signal having a predetermined logic state, e.g., high, indicating a change in the memory location addresses), and a reset input R.

Block or flip-flop 2 presents an output 3 connected to one input of an AND gate 60, the other input of which is connected to the output of an inverter 61 supplied with signal ATD. The output of the AND gate 60, which supplies a synchronizing signal SYNC, is connected to both an inverter 4 and an adjustable delay or propagation line 5. More specifically, adjustable delay line 5 comprises three identical, cascade connected, asymmetrical delay blocks 6, 7, 8, each supplying a unitary delay τ (e.g., 7 ns in one preferred embodiment) when the SYNC signal switches from a first to a second logic state (e.g., from "0" to "1"), and each presenting a much smaller delay (ideally zero) for rapid resetting when the signal switches in the opposed way. As blocks 6–8 are identical in the illustrated embodiment, only the circuit diagram of delay block 6 is illustrated in detail. As shown, the delay block 6 comprises a pair of cascade connected inverters 10, 11 output-connected to respective capacitors 12, 13. For achieving the required asymmetrical switch delay, the inverters are formed in a known manner by CMOS transistors differing appropriately in size so as to vary the current through them and charge or discharge capacitors 12, 13.

The input and output bypass nodes 15, 16 of block 7 are connected to a switching element or switch 17 for selectively connecting either node 15 or 16 to a bypass line 18. Switching element 17 (which may be formed in any known manner, e.g., by a pair of push-pull switches) presents a first enable signal line 19 supplied with a digital signal PCS, generated by fuse 22. The logic state of PCS indicates whether the precharge (or equalizing) time interval is to be short or long. Signal PCS is generated in a fuse block 20 comprising a timing fuse 21, a precharge fuse 22, and a detecting fuse 23. Fuses 21–23 constitute digital memory elements, the content of which is set at the memory debugging phase, taking into account the characteristics of memory 100. In practice, fuses 21–23 generate logic signals (TIMS, DETS, and PCS), using output node signals 31, 34, the states of which respectively provide for establishing slow or fast timing, long or short detecting time, and, as already stated, a long or short precharge interval.

Bypass line 18 and output node 26 of delay block 8 are connected to a second switching element 27, similar to 17, for selectively connecting either node 26 or bypass line 18 to a bypass node 28; and, like switching element 17, element 27 presents a second enable signal line 29 supplied with digital signal TIMS generated by fuse 21.

Node 28 is connected to one input of a NOR gate 30, the other input of which is connected to the output of inverter 4, and the output of which is connected to an output node 31 supplying a precharge signal PC to fuse 22. Output node 31 is connected to one input of a further NOR gate 33, the other input of which is connected to the output of inverter 4, and the output of which is connected to an output node 34 supplying a detecting signal DET to fuse 23. Node 34 is also connected to a second adjustable delay or propagation line 37 comprising three cascade connected delay blocks 38–40 similar to blocks 6–8 of propagation line 5.

The input bypass node 42 of delay block 39 (also constituting the output of block 38) and the output bypass node 43 of block 39 (also constituting the input of block 40) are connected to a third switching element 44 similar to elements 17, 27 and presenting a third enable signal line 45 supplied with logic signal DETS which determines which of nodes 42, 43 is to be connected to a bypass line 48. A similar switching element 50 is interposed between bypass line 48 and the output node 51 of block 40, on the one hand, and a circuit output node 52 on the other, and presents a fourth enable signal line 53 supplied with signal TIMS, generated by fuse 21 which determines whether line 48 or node 51 is to be connected to node 52 by switching element 50.

Output node 52, which supplies an output enabling signal OE, is connected to a first input of an AND gate 63, a second input of which is supplied with an enabling signal EN. The output of AND gate 63 is connected to a delay block 55 for generating external read enabling signals (not shown) at a first output 64. Block 55 also presents a second output 56 at which an END pulse signal is generated upon completion of the external data reading. More specifically, delay block 55, a last adjustable delay or propagation line, takes into account the propagation and storage time of the data read from the memory array cells to the output circuits of the memory, and, for the purpose of the present description, may be considered equivalent to a single-shot circuit which, a certain time after detection of low-to-high switching of the output signal of AND gate 63 (corresponding to the external read phase), generates the END pulse signal at output 56. Output 56 is connected to one input of an OR gate 66 which is also supplied with inverted enabling signal ENN, and the output of which is connected to reset input R of flip-flop 2.

When debugging memory 100 and on the basis of tests to determine the typical delay times of the memory components, the logic value of signals PCS, TIMS and DETS, which determines the position of the switching elements and hence the type of timing, is set by means of fuses 21–23. In the first tests, the logic value corresponding to slow timing and long precharge and detecting intervals is conveniently selected for the timing logic signals, but, if testing indicates the presence of fast memory elements, the settings are changed to achieve faster timing.

FIG. 1 shows the minimum delay situation wherein switches 17, 27, 44 and 50 We so positioned as to connect node 28 to node 15, and node 52 to node 42, and each propagation lines 5, 37 generates a delay $\tau$.

Conversely, if logic signal PCS presents the opposite logic state, switch 17 is so positioned as to connect line 18 to node 16, and propagation line 5 generates a delay of $2\tau$.

Similarly, if logic signal DETS presents the opposite logic state, the switch is so positioned as to connect line 48 to node 43, and propagation line 37 generates a delay of $2\tau$.

Conversely, if switches 27 and 50 are set to the opposite position to that shown (corresponding to long timing), the position of switches 17 and 44 is negligible, and propagation lines 5 and 37 both supply a delay of $3\tau$. Propagation lines 5, 37 are therefore capable of supplying a total delay of $2\tau$, $3\tau$, $4\tau$ or $6\tau$ through the cascade connected symmetrical relay blocks 6–8 and 38–40.

Operation of the FIG. 1 circuit will now be described with reference also to FIG. 2, assuming zero switch times of the logic circuits, and with initial reference to the minimum delay situation, i.e., with switches 17, 27, 44 and 50 in the positions shown, corresponding to the continuous-line signal graphs in FIG. 2.

In the reset state and circuit enabling condition (signal EN high, signal ENN low), the output of flip-flop 2, the SYNC signal, the outputs of delay blocks 6–8 and 38–40, and signals PC, DET and OE are all low. On receiving a predetermined edge of signal ATD (in this case, the leading edge, instant $t_0$), output 3 of logic block 2 switches high, but the SYNC signal remains low by virtue of the low output of inverter 61. At the end of the ATD pulse (instant $t_1$), the output of inverter 61 switches to high, thus switching the SYNC signal to high. Pending switching of the SYNC signal being transmitted along propagation line 5, NOR gate 30 receives two low signals determined by the output of inverter 4 which has switched immediately, and the signal at node 28 which has not yet switched. Consequently, signal PC switches to high, whereas NOR gate 33 still presents a high signal at its input (connected to node 31) and therefore does not change state.

Upon switching of the SYNC signal being transmitted along the delay line, after delay $\tau$ determined by block 6, NOR gate 30 again switches, and this time also NOR gate 33 (instant $t_2$), so that signal PC switches back to low and signal DET switches to high.

After delay τ corresponding to the transmission time of the switching edge of signal DET to block 38, signal OE also switches to high (instant $t_3$); and, after a given time determined by delay block 55, the END signal presents a pulse, one edge (e.g., the leading edge) of which resets logic block 2 and switches the SYNC signal to low (instant $t_5$). Since propagation lines 5, 37, as already stated, are asymmetrical, the trailing edge of the SYNC signal is transmitted extremely rapidly to restore circuit 1 to the reset state, wherein all the signals are low, with a negligible delay not shown in FIG. 2.

Figure 2:
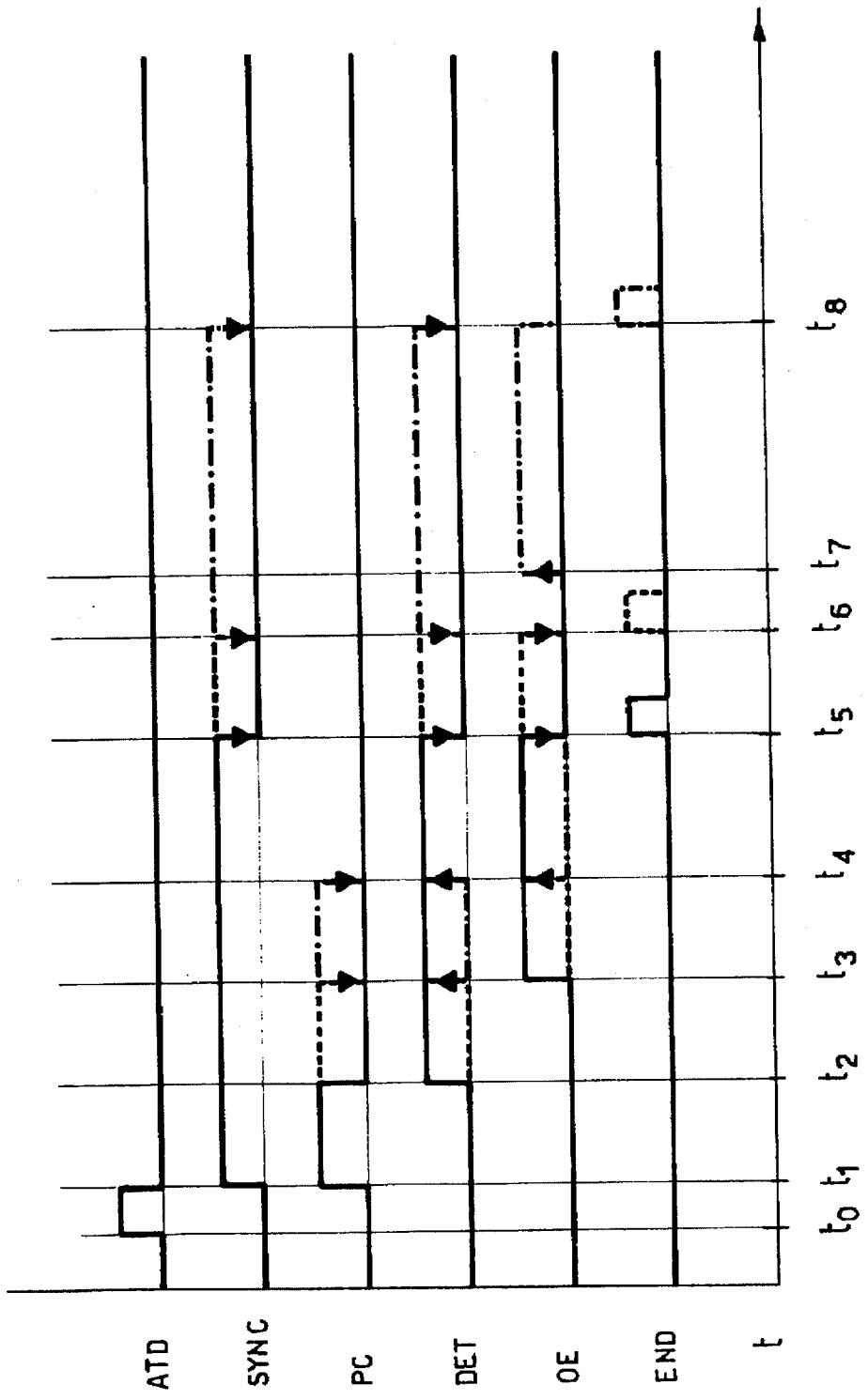
FIG. 2 is a time graph of a number of the signals used in the circuit of FIG. 1.

Conversely, if a long precharge interval is set (switch 17 connecting node 16 to line 18) while at the same time maintaining a short detecting interval, signal PC switches to low with a delay 2τ with respect to instant $t_1$, i.e., at instant $t_3$, as shown by the dotted line in FIG. 2. Consequently, signal DET also switches to high at instant $t_3$, signal OE switches to high at instant $t_4$, delayed by τ with respect to $t_3$, and the END pulse is generated with the same delay so as to present its leading edge at instant $t_6$ at which circuit 1 is reset.

Similarly, in the case of a short precharge interval and a long detecting interval (switch 44 connecting line 48 to node 43), signal PC again switches to low at instant $t_2$ (continuous-line curve) together with low-to-high switching of signal DET, whereas signal OE switches to high with a delay 2τ with respect to $t_2$, i.e., at instant $t_4$ (dotted line). As such, generation of the END pulse is also delayed so that reset occurs at instant $t_6$.

Conversely, in the case of a slow timing setting (switches 27, 50 connecting node 28 to node 26 and node 52 to node 51), signal PC switches to low and signal DET to high with a delay 3τ with respect to instant $t_1$, i.e., at instant $t_4$, as shown by the dot-and-dash line; and signal OE switches to high with a delay 3τ with respect to $t_4$, i.e., at instant $t_7$, so that the leading edge of the END pulse and reset of circuit 1 occur at instant $t_8$.

Signals EN and ENN provide for preventing signal OE from being transmitted to delay block 55, and for resetting the circuit in the event circuit 1 is disabled, e.g., in the event reading of the memory is not required. When low, in fact, signal EN prevents block 55 from being enabled, while signal ENN, when high, resets flip-flop 2 (and hence the whole of circuit 1) by switching output 3 of flip-flop 2 and the SYNC signal to low.

The advantages of the circuit described are legion. For example, despite being a dynamic type for reducing consumption and maximizing operating speed, it also provides for flexible timing, adaptable to the characteristics of the memory, which timing may be adjusted at various phases for selectively modifying the precharge and detecting phases as required, or may be so set as to provide for slow timing in all the phases, while still providing the best solution, in terms of speed and consumption, compatible with the characteristics of the memory. Additionally, the circuit is easily adaptable to various conditions by merely setting one or more fuses or other permanent memory elements. Moreover, the modularity of the delays determined by the delay lines provides for achieving a simple, reliable configuration composed of various identical and therefore similarly operating parts, while at the same time permitting different delays according to the application involved.

Clearly, changes may be made to the circuit as described and illustrated herein without, however, departing from the scope of the present invention. In particular, changes may be made to the number of delay stages on each line, and to the unitary delay determined by each stage; or, as stated, the stages may provide for different delays. Moreover, though specific reference is made herein to the memory read phases, the circuit may also be used for generating other dynamic phases requiring flexibility to adapt to different requirements. Furthermore, though the circuit described provides for modifying the duration of the SYNC clock signal pulses according to the delays along the propagation lines, hybrid solutions with a timing circuit generating a fixed-frequency SYNC clock signal may be formed for simply modulating the precharge and detecting phases within the fixed duration of the clock pulse. Similarly, the invention may also be implemented in a timing circuit generating a SYNC clock signal with only two pulse duration values corresponding respectively to a slow and fast timing configuration, each configuration, or at least one of them, providing for modulating the precharge and detecting phases.

The detailed description provided above illustrates preferred embodiments of the present invention. This description will enable those skilled in the art to make various modifications to these embodiments that do not depart from the spirit and the scope of the present invention. Accordingly, the present invention is not limited to the above-described preferred embodiments, but instead contemplates all such modifications that read on the appended claims and equivalents thereof.

We claim:

1. A dynamic internal timing method for a programmable memory, comprising the steps of:

generating enabling signals for operating steps of said memory;

enabling said enabling signals;

propagating said enabling signals along at least one propagation line; and selectively enabling delay elements along said at least one propagation line, wherein said step of generating enabling signals comprises the generation of enabling signals of predetermined duration and adjustable to the speed characteristics of said memory.

2. A method as claimed in claim 1 further comprising the steps of:

setting the duration of said enabling signals to a predetermined value;

determining speed characteristics of said memory; and adjusting said set duration to said determined speed characteristics.

3. A method as claimed in claim 2 wherein said step of setting said duration comprises the step old setting a maximum duration of said enabling signals.

4. A method as claimed in claim 1 wherein said enabling signals comprise the precharge, detecting and storing signals for reading said memory.

5. A circuit comprising:

programmable memory; and enable generating means for generating enable signals for operating steps of said memory wherein said enable generating means comprise duration adjusting means for adjusting the duration of said enable signals to the speed characteristics of said memory and so generating enable signals of predetermined, adjustable duration, and, wherein said enable generating means comprise enable means for enabling said enable signals; and said duration adjusting means comprise at least one propagation line connected to said enable means and comprising selectively enabled delay elements and delay enabling means connected to and for selectively enabling said delay elements.

6. A circuit as claimed in claim 5 wherein said delay elements comprise a number of cascade connected, selectively enabled unitary delay blocks.

7. A circuit as claimed in claim 6 wherein said delay blocks present an asymmetric propagation delay.

8. A circuit as claimed in claim 5, further comprising:
bypass lines for said delay elements; said bypass lines comprising controlled switching means for enabling/disabling said bypass lines.

9. A circuit as claimed in claim 8 wherein said delay enabling means comprise memory elements connected to control terminals of said controlled switching means.

10. A circuit comprising:
a programmable memory; and
enable generating means for generating enable signals for operating steps of said memory wherein said enable generating means comprise duration adjusting means for adjusting the duration of said enable signals to the speed characteristics of said memory and so generating enable signals of predetermined, adjustable duration wherein said enable generating means are read step generating means, and comprise a precharge enabling section for generating a precharge enabling signal of predetermined, adjustable duration:
a detecting enabling section for generating a detecting enabling signal of predetermined, adjustable duration; and
a storing enabling section for generating storing enabling signal of predetermined, adjustable duration.

11. A circuit as claimed in claim 10, the circuit further comprising:
timing duration setting means, precharge duration setting means and detection duration setting means connected to said precharge, detecting and storing enabling sections, for generating slow or fast overall timing signals and short or long precharge and detecting signals.

12. A dynamic internal timing circuit for use with a programmable memory, the dynamic internal timing circuit comprising:
a first delay element having an input and an output;
a second delay element having an input and an output, the input of the second delay element being coupled to the output of the first delay element;
a first enable signal line; and
a first switch having a control terminal, a first path terminal, and a second path terminal, the control terminal being coupled to the first enable signal line, the first path terminal being coupled to the output of the first delay element, and the second path terminal being coupled to the output of the second delay element.

13. The dynamic internal timing circuit of claim 12, further comprising:
a timing logic block having a first input, a second input, and an output, the first input being coupled an address change indicating signal and the output being coupled to the input of the first delay element.

14. The dynamic internal timing circuit of claim 13 wherein the output of the timing logic block is coupled to the input of the first delay element via a coupling logic gate, the coupling logic gate comprising:

a first input that is coupled to the output of the timing logic block;
a second input that is coupled to an inverted state of the address indicating signal; and
an output that is coupled to the input of the first delay element.

15. The dynamic internal timing circuit of claim 12, further comprising:
a third delay element having an input and an output, the input of the third delay element being coupled to the output of the second delay element; and
a second switch having a control terminal, a first path terminal, and a second path terminal, the control terminal being coupled to the second enable signal line, the first path terminal being coupled to the control terminal of the first switch, and the second path terminal being coupled to the output of the third delay element.

16. The dynamic internal timing circuit of claim 15, further comprising:
a first logic gate interposed between the second switch and the first enable signal line, the first logic gate having a first input, a second input, and an output, the first input being coupled to the control terminal of the second switch, and the output being coupled the first enable signal line;
a second enable signal line;
a second logic gate having a first input, a second input, and an output, the first input being coupled to the output of the first logic gate, the second input being coupled to the second input of the first logic gate, and the output being coupled to the second enable signal line;
a timing logic circuit having a synchronizing signal output, the synchronizing signal output being coupled to the input of the first-delay element and being further coupled to the second input of the second logic gate.

17. The dynamic internal timing circuit of claim 16 wherein the synchronizing signal output is coupled to the second input of the second logic gate via an inverting element.

18. The dynamic internal timing circuit of claim 16, further comprising:
a fourth delay element having an input and an output, the input being coupled to the output of the second logic gate;
a fifth delay element having an, input and an output, the input of the fifth delay element being coupled to the output of the fourth delay element;
a third enable signal line; and
a third switch having a control terminal, a first path terminal, and a second path terminal the control terminal being coupled to the third enable signal line, the first path terminal being coupled to the output of the fourth delay element, and the second path terminal being coupled to the output of the fifth delay element.

19. The dynamic internal timing circuit of claim 18, further comprising:
a circuit enable signal;
a third logic gate having a first input, a second input, and an output, the first input being coupled to the third enable signal line and the second input being coupled to the circuit enable signal; and
an external read signal generating circuit having an input and an output, the input being coupled to the output of the third logic gate.

20. The dynamic internal timing circuit of claim 19 wherein the timing logic circuit comprises:

a pulse signal;

a flip-flop having a first input, a second input, and an output, the first input being coupled to the pulse signal, the second input being coupled to the output of the external read signal generating circuit; and a fourth logic gate having a first input, a second input, and an output, the first input being coupled to an inverted version of the pulse signal, the second input being coupled to the output of the flip-flop, and the output constituting the synchronizing signal output of the timing logic circuit.

21. The dynamic internal timing circuit of claim 20 wherein the second input of the flip-flop is coupled to the output of the external read generating circuit via a connecting circuit; the connecting circuit comprising:

a supplemental enabling signal; and a fifth logic gate having a first input, a second input, and an output, the first input being coupled to the supplemental enabling signal, the second input being coupled to output of the external read generating circuit, and the output being coupled to the second input of the flip-flop.

* * * * *